US006699789B2

(12) United States Patent
Yang et al.

(10) Patent No.: US 6,699,789 B2
(45) Date of Patent: Mar. 2, 2004

(54) METALLIZATION PROCESS TO REDUCE STRESS BETWEEN AL-CU LAYER AND TITANIUM NITRIDE LAYER

(75) Inventors: Zhih-Sheng Yang, Hsinchu (TW); Chung-Yan Cheng, Hsinchu (TW); Ying-Yan Huang, Hsinchu (TW); Jason C. S. Chu, Hsinchu (TW)

(73) Assignee: Mosel Vitelic, Inc., Hsinchu (TW)

(*) Notice: Subject to any disclaimer, the term of this patent is extended or adjusted under 35 U.S.C. 154(b) by 0 days.

(21) Appl. No.: 10/113,705

(22) Filed: Mar. 27, 2002

(65) Prior Publication Data
US 2002/0142573 A1 Oct. 3, 2002

(30) Foreign Application Priority Data
Apr. 3, 2001 (TW) ........................................ 90107953 A

(51) Int. Cl.[7] ............................................. H01L 21/443
(52) U.S. Cl. .................... 438/679; 438/685; 438/688
(58) Field of Search ................................. 438/652, 653, 438/654, 656, 660, 679, 685, 688, 782

(56) References Cited

U.S. PATENT DOCUMENTS

| 5,994,217 A | * | 11/1999 | Ng .............................. 438/636 |
| 6,144,097 A | * | 11/2000 | Asahina et al. .............. 257/751 |
| 6,187,667 B1 | * | 2/2001 | Shan et al. ................... 438/636 |
| 6,372,645 B1 | * | 4/2002 | Liu et al. ..................... 438/688 |
| 6,458,703 B2 | * | 10/2002 | Endo et al. .................. 438/688 |
| 2001/0048980 A1 | * | 12/2001 | Kishimoto et al. .......... 427/569 |
| 2002/0014696 A1 | * | 2/2002 | Asahina et al. .............. 257/751 |

* cited by examiner

Primary Examiner—Carl Whitehead, Jr.
Assistant Examiner—Stephen W. Smoot
(74) Attorney, Agent, or Firm—Townsend and Townsend and Crew LLP

(57) ABSTRACT

Embodiments of the present invention are directed to a metallization process for reducing the stress existing between the Al—Cu layer and the titanium nitride (TiN) layer, and solving the galvanic problem. The process does so by cooling the wafer in the vacuum apparatus where the metallization process is performed after formation of the Al—Cu layer and before the formation of the TiN layer. In accordance with an aspect of the present invention, a metallization process comprises placing a wafer in an Al—Cu sputtering chamber to form an Al—Cu layer on the wafer, and transferring the wafer to a titanium nitride sputtering chamber. An inert gas is introduced into the titanium nitride sputtering chamber to cool the wafer. A titanium nitride layer is formed on the Al—Cu layer of the wafer in the titanium nitride sputtering layer after cooling the wafer.

20 Claims, 3 Drawing Sheets

METALLIZATION PROCESS TO REDUCE STRESS BETWEEN AL-CU LAYER AND TITANIUM NITRIDE LAYER

CROSS-REFERENCES TO RELATED APPLICATIONS

This application claims priority from R.O.C. patent application Ser. No. 090107953, filed Apr. 3, 2001, the entire disclosure of which is incorporated herein by reference.

BACKGROUND OF THE INVENTION

The present invention relates to semiconductor processes and, more particularly, to a metallization process for reducing the stress existing between the Al—Cu layer and the titanium nitride (TiN) layer, and solving a galvanic problem.

In fabricating a multi-level interconnecting structure, aluminum alloys of low resistance and good adhesion to $SiO_2$ are used to form the wiring layer. In common use of Al—Cu alloy, since Cu ions can prevent problems of spiking and electromigration, an Al—Cu wiring layer has good reliability. In the conventional metallization process, a Ti layer serving as a barrier layer, an Al—Cu layer, and a titanium nitride layer serving as an anti-reflective layer are sequentially deposited on a wafer. Then, using a patterned photoresist layer as a mask, the titanium nitride/Al—Cu/Ti layers are patterned to form the wiring line. However, the titanium nitride/Al—Cu/Ti layers are deposited in the same high-vacuum system, but in different sputtering chambers with different process temperatures, wherein the Al—Cu layer is deposited at 270° C. and the titanium nitride layer is deposited at room temperature. Therefore, at the beginning of sputtering titanium nitride, the wafer with the Al—Cu layer is still in a high-temperature state and thermal stress is produced between the Al—Cu layer and the titanium nitride layer, resulting cracks on the titanium nitride layer. Furthermore, in the subsequent photolithography process, the developer solution easily infiltrates from the cracks to the Al—Cu layer to cause an oxidation-reduction reaction. As a result, a galvanic corrosion occurs in the wiring layer. This leads to defective circuits.

Seeking to solve the above-described problem, U.S. Pat. No. 5,994,217 discloses a method of employing annealing for releasing the stress existing between the titanium nitride layer and Al—Cu layer. However, adding the step of annealing increases the thermal budget and decreases the property of the semiconductor device. In another disclosed method, prior to the deposition of the titanium nitride layer, the wafer with the Al—Cu layer is cool down by taking it out from the vacuum system. But, this substantially reduces the yield.

BRIEF SUMMARY OF THE INVENTION

Embodiments of the present invention are directed to a metallization process for reducing the stress existing between the Al—Cu layer and the titanium nitride (TiN) layer, and solving the galvanic problem. The process does so by cooling the wafer in the vacuum apparatus where the metallization process is performed after formation of the Al—Cu layer and before the formation of the TiN layer. The wafer may be cooled, for instance, by fanning the wafer with an inert gas. In some embodiments, the wafer is transferred from the Al—Cu sputtering chamber to the titanium nitride sputtering chamber after formation of the Al—Cu layer at a high temperature. The wafer is cooled in the titanium nitride sputtering chamber before formation of the TiN layer, by introducing an inert gas into the titanium nitride sputtering chamber.

In accordance with an aspect of the present invention, a metallization process comprises placing a wafer in an Al—Cu sputtering chamber to form an Al—Cu layer on the wafer, and transferring the wafer to a titanium nitride sputtering chamber. An inert gas is introduced into the titanium nitride sputtering chamber to cool the wafer. A titanium nitride layer is formed on the Al—Cu layer of the wafer in the titanium nitride sputtering layer after cooling the wafer.

In some embodiments, the Al—Cu layer is formed at a temperature of about 260–280° C., and the titanium nitride layer is formed on the Al—Cu layer at a temperature of about room temperature. The inert gas may comprise nitrogen or argon. The inert gas is injected into the titanium nitride sputtering chamber to fan the wafer until the wafer is cooled to a temperature of about 60–80° C. In specific examples, the inert gas is introduced into the titanium nitride sputtering chamber at a flow rate of about 80–120 sccm and a flow time of about 20–30 seconds. The inert gas introduced into the titanium nitride sputtering chamber to cool the wafer is terminated before forming the titanium nitride layer. The Al—Cu sputtering chamber and the titanium nitride sputtering chamber are typically contained in a sputtering apparatus at a vacuum state.

In accordance with another aspect of the present invention, a method for forming a wiring line comprises placing a wafer in a Ti sputtering chamber to form a Ti layer on the wafer, and transferring the wafer to an Al—Cu sputtering chamber to form an Al—Cu layer on the Ti layer. The wafer is transferred to a titanium nitride sputtering chamber. An inert gas is introduced into the titanium nitride sputtering chamber to cool the wafer. A titanium nitride layer is formed on the Al—Cu layer of the wafer in the titanium nitride sputtering layer after cooling the wafer.

Another aspect of the invention is directed to a metallization process performed in a vacuum sputtering apparatus which includes an Al—Cu sputtering chamber and a titanium nitride sputtering chamber. The metallization process comprises placing a wafer in an Al—Cu sputtering chamber to form an Al—Cu layer on the wafer, cooling the wafer in the vacuum sputtering apparatus to a preset temperature, and transferring the wafer to a titanium nitride sputtering chamber. A titanium nitride layer is formed on the Al—Cu layer of the wafer in the titanium nitride sputtering chamber after cooling the wafer. The preset temperature is sufficiently low to reduce thermal stresses between the titanium nitride layer and the Al—Cu layer so as to substantially prevent cracks from forming in the titanium nitride layer.

In some embodiments, the wafer is cooled by fanning the wafer with an inert gas. The wafer may cooled after transferring the wafer to the titanium nitride sputtering chamber, for instance, by introducing the inert gas into the titanium nitride sputtering chamber to fan the wafer with the inert gas.

DETAILED DESCRIPTION OF THE INVENTION

Figure 1:
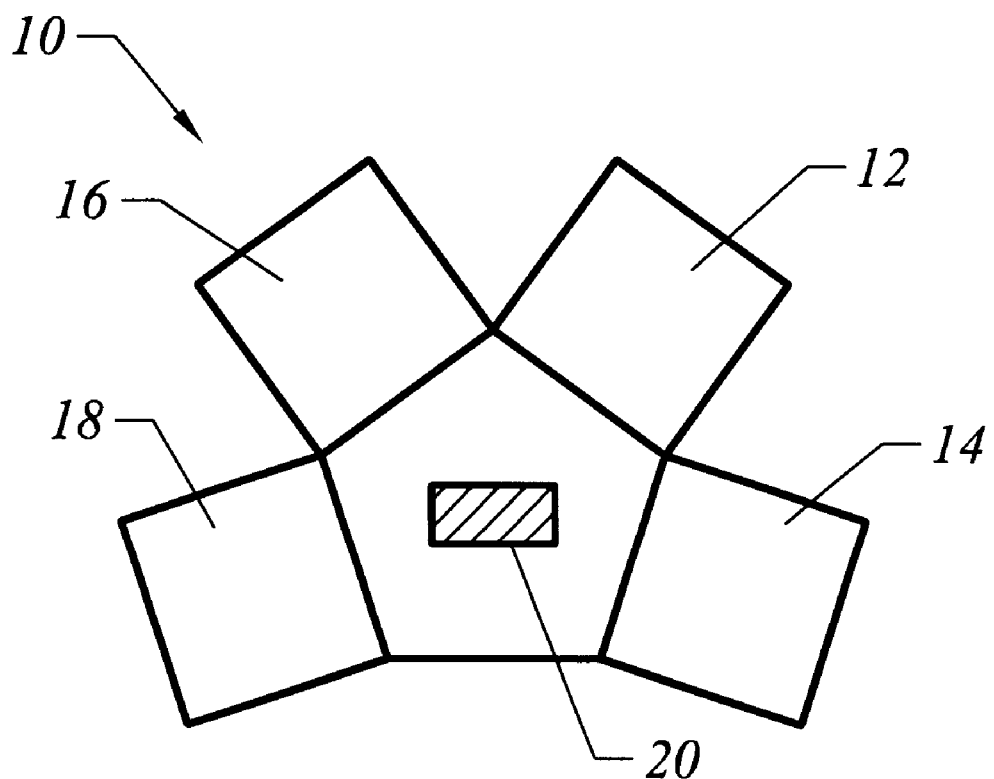
FIG. 1 is a simplified schematic view of a sputtering apparatus used in the metallization process according to an embodiment of the present invention.

Embodiments of the present invention are directed to a metallization process performed in a sputtering apparatus 10 as shown in FIG. 1. The sputtering apparatus 10 comprises a Ti sputtering chamber 12, an Al—Cu sputtering chamber 14, a titanium nitride sputtering chamber 16, and an etching chamber 18, which are maintained in a fixed vacuum state. In addition, a mechanical arm 20 is used to transfer a wafer from one chamber to another chamber in the sputtering apparatus 10.

Figure 2:
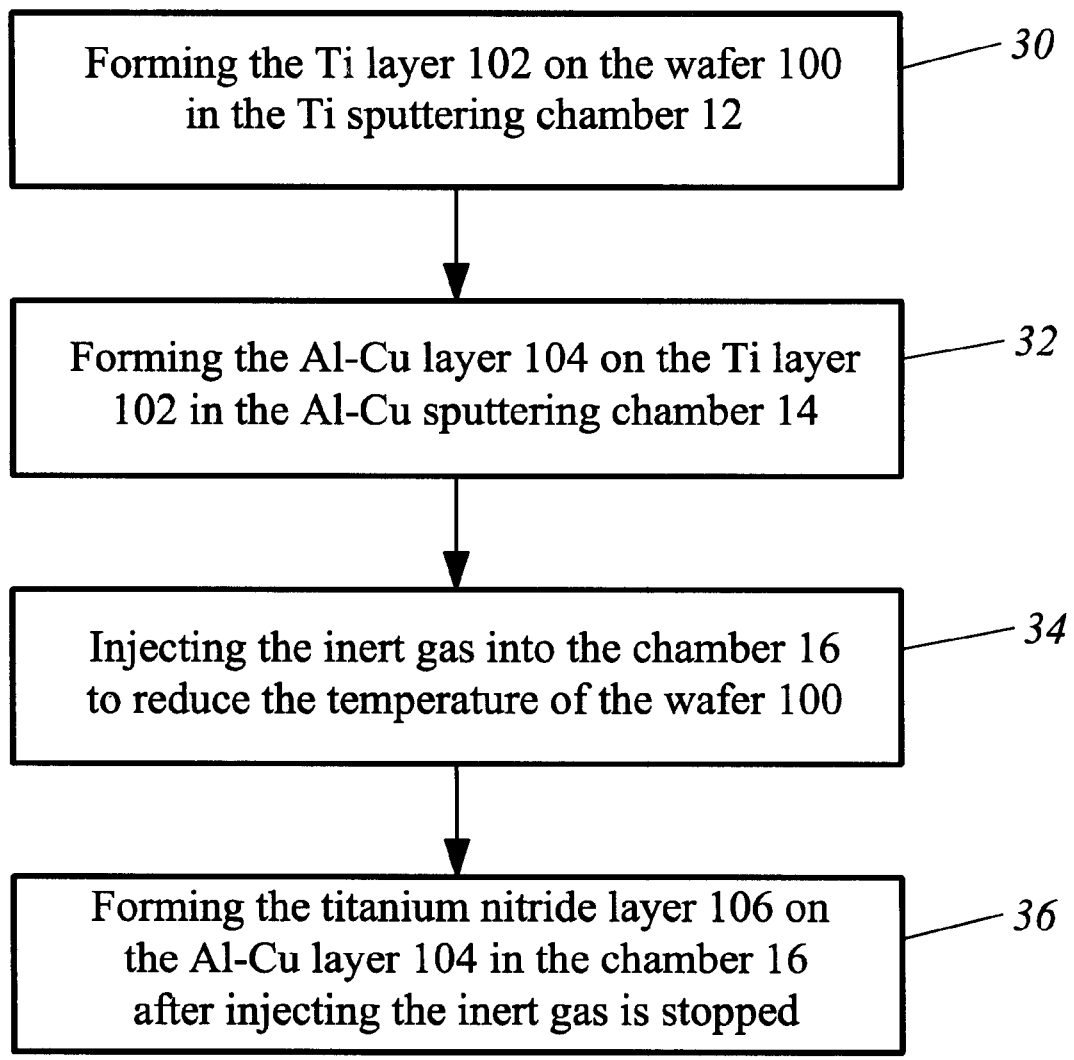
FIG. 2 is a flow chart of the metallization process according to an embodiment of the present invention.
Figure 3A:
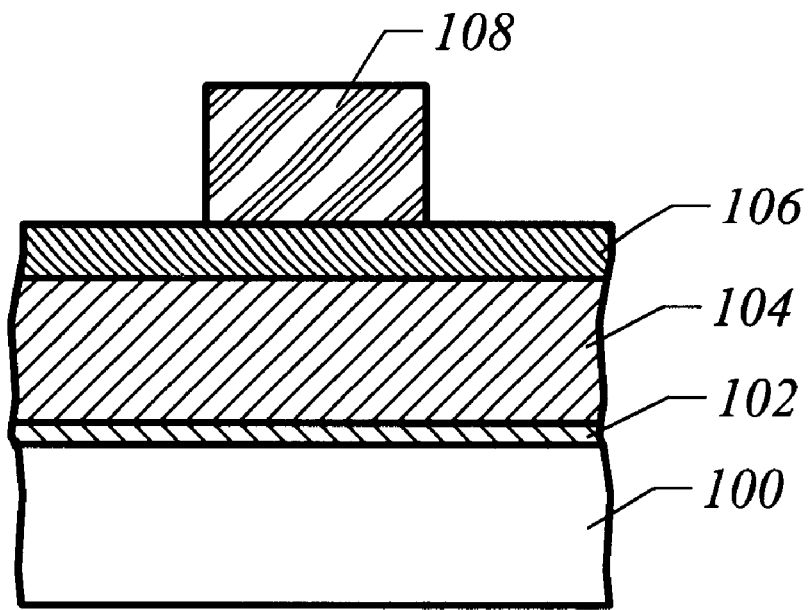
FIGS. 3A and 3B are cross-sectional views showing the metallization process and the photolithography process to form a wiring line on a substrate according to an embodiment of the present invention.
Figure 3B:
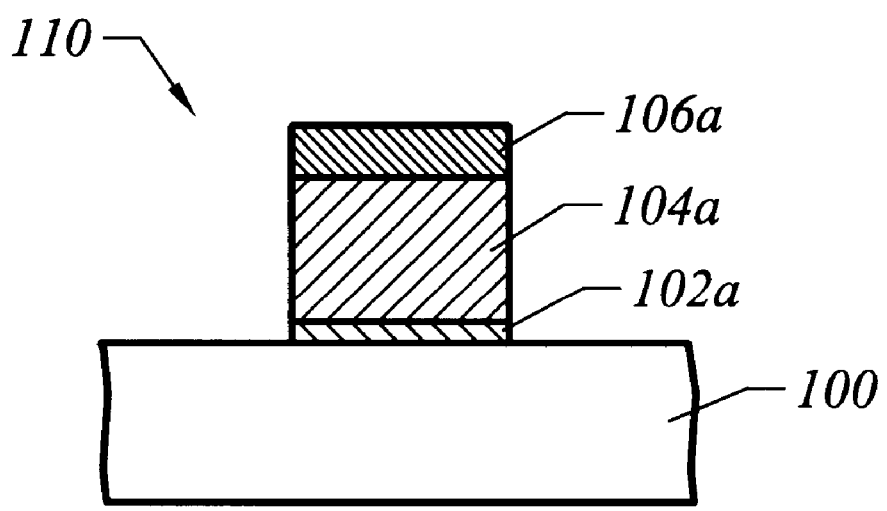

FIG. 2 is a flow chart of the metallization process according to an embodiment of the present invention. FIGS. 3A and 3B are cross-sectional views illustrating the metallization process and the photolithography process according to an embodiment of the invention.

First, at step 30, a physical vapor deposition is performed in the Ti sputtering chamber 12 to form a Ti layer 102 on a wafer 100, which is typically a semiconductor silicon substrate. Then, at step 32, the wafer 100 is transferred to the Al—Cu sputtering chamber 14 and a high-temperature physical vapor deposition is performed to form an Al—Cu layer 104 on the Ti layer 102. The process temperature is typically about 260–280° C., more desirably about 270° C. Next, at step 34, the wafer 100 is transferred to the titanium nitride sputtering chamber 16 and inert gases are injected into the chamber 16 for fanning the high-temperature wafer 100 until the temperature of the wafer 100 is reduced to about 60–80° C. The inert gas is introduced into the chamber 16 at a temperature of substantially less than 260–280° C., and is typically provided at about room temperature. The inert gas may be nitrogen or argon. In specific embodiments, the flow rate is about 80–120 sccm, and the flow time is about 20–30 seconds. The inert gas may be injected directly onto the wafer 100 or near the wafer to fan the wafer until it is cooled to the desired temperature.

Next, at step of 36, after the temperature of the wafer 100 is decreased to within a pennissible range, the flow of inert gas is terminated and then the physical vapor deposition is perform at room temperature to form a titanium nitride layer 106 on the Al—Cu layer 104. Since the temperature of the wafer 100 is decreased prior to the deposition of the titanium nitride layer 106, the thermal stress between the titanium nitride layer 106 and the Al—Cu layer 104 is reduced. The permissible temperature range is selected so as to prevent cracks from forming in the titanium nitride layer 106. That temperature range is typically about 60–80° C.

In the subsequent photolithography process, a patterned photoresist layer 108 is formed on the titanium nitride layer 106, and then an anisotropical etch of the exposed regions of the titanium nitride layer 106/Al—Cu layer 104/Ti layer 102 is performed. The remaining portions of the titanium nitride layer 106a/Al—Cu layer 104a/Ti layer 102a form a wiring line 110, serving as part of the interconnect. Because the formation of cracks in the titanium nitride layer 106 is substantially avoided, the developer solution used in the photolithography process cannot filtrate into the Al—Cu layer 104. Therefore, the galvanic problem is solved to ensure the quality of the wiring line 110.

The above-described arrangements of apparatus and methods are merely illustrative of applications of the principles of this invention and many other embodiments and modifications may be made without departing from the spirit and scope of the invention as defined in the claims. For instance, after deposition of the Al—Cu layer, the wafer may be cooled in a different location within the sputtering apparatus 10 prior to being transferred to the titanium nitride sputtering chamber 16. The scope of the invention should, therefore, be determined not with reference to the above description, but instead should be determined with reference to the appended claims along with their full scope of equivalents.

What is claimed is:

1. A metallization process comprising:
   placing a wafer in an Al—Cu sputtering chamber to form an Al—Cu layer on the wafer;
   transferring the wafer to a titanium nitride sputtering chamber;
   introducing an inert gas into the titanium nitride sputtering chamber to cool the wafer by fanning the wafer with the inert gas to a temperature sufficiently low to reduce thermal stresses between the titanium nitride layer and the Al—Cu layer; and
   forming a titanium nitride layer on the Al—Cu layer of the wafer in the titanium nitride sputtering chamber after cooling the wafer.

2. The metallization process of claim 1 wherein the Al—Cu layer is formed at a temperature of about 260–280° C., and the titanium nitride layer is formed on the Al—Cu layer at a temperature of about room temperature.

3. The metallization process of claim 1 wherein the inert gas comprises nitrogen.

4. The metallization process of claim 1 wherein the inert gas comprises argon.

5. The metallization process of claim 1 wherein the inert gas is injected into the titanium nitride sputtering chamber to fan the wafer until the wafer is cooled to a temperature of about 60–80° C.

6. The metallization process of claim 1 wherein the inert gas is introduced into the titanium nitride sputtering chamber at a flow rate of about 80–120 sccm and a flow time of about 20–30 seconds.

7. The metallization process of claim 1 wherein the inert gas introduced into the titanium nitride sputtering chamber to cool the wafer is terminated before forming the titanium nitride layer.

8. The metallization process of claim 1 wherein a Ti layer is formed on the wafer, prior to forming the Al—Cu layer, to be disposed between the wafer and the subsequently formed Al—Cu layer.

9. The metallization process of claim 1 wherein the Al—Cu sputtering chamber and the titanium nitride sputtering chamber are contained in a sputtering apparatus at a vacuum state.

10. A method for forming a wiring line, comprising:
    placing a wafer in a Ti sputtering chamber to form a Ti layer on the wafer;
    transferring the wafer to an Al—Cu sputtering chamber to form an Al—Cu layer on the Ti layer;
    transferring the wafer to a titanium nitride sputtering chamber;
    introducing an inert gas into the titanium nitride sputtering chamber to cool the wafer by fanning the wafer with the inert gas to a temperature sufficiently low to reduce thermal stresses between the titanium nitride layer and the Al—Cu layer; and
    forming a titanium nitride layer on the Al—Cu layer of the wafer in the titanium nitride sputtering chamber after cooling the wafer.

11. The method of claim 10 wherein the Al—Cu layer is formed at a temperature of about 260–280° C., and the titanium nitride layer is formed on the Al—Cu layer at a temperature of about room temperature.

12. The method of claim 10 wherein the inert gas comprises nitrogen.

13. The method of claim 10 wherein the inert gas comprises argon.

14. The method of claim 10 wherein the inert gas is injected into the titanium nitride sputtering chamber to fan the wafer until the wafer is cooled to a temperature of about 60–80° C.

15. The method of claim 10 wherein the inert gas is introduced into the titanium nitride sputtering chamber at a flow rate of about 80–120 sccm and a flow time of about 20–30 seconds.

16. The method of claim 10 wherein the inert gas introduced into the titanium nitride sputtering chamber to cool the wafer is terminated before forming the titanium nitride layer.

17. The method of claim 10 wherein the Al—Cu sputtering chamber and the titanium nitride sputtering chamber are contained in a sputtering apparatus at a vacuum state.

18. A metallization process performed in a vacuum sputtering apparatus which includes an Al—Cu sputtering chamber and a titanium nitride sputtering chamber, the metallization process comprising:

placing a wafer in an Al—Cu sputtering chamber to form an Al—Cu layer on the wafer;

cooling the wafer in the vacuum sputtering apparatus to a preset temperature by fanning the wafer with inert gas;

transferring the wafer to a titanium nitride sputtering chamber; and forming a titanium nitride layer on the Al—Cu layer of the wafer in the titanium nitride sputtering chamber after cooling the wafer, the preset temperature being sufficiently low to reduce thermal stresses between the titanium nitride layer and the Al—Cu layer so as to substantially prevent cracks from forming in the titanium nitride layer.

19. The metallization process of claim 18 wherein the wafer is cooled to a temperature of about 60–80° C.

20. The metallization process of claim 19 wherein the wafer is cooled, after transferring the wafer to the titanium nitride sputtering chamber, by introducing the inert gas into the titanium nitride sputtering chamber to fan the wafer with the inert gas.

* * * * *